United States Patent [19]

Fosler, Jr. et al.

[11] 4,005,395
[45] Jan. 25, 1977

[54] COMPATIBLE STANDBY POWER DRIVER FOR A DYNAMIC SEMICONDUCTOR

[75] Inventors: Dick E. Fosler, Jr.; Thomas L. Krocheski, both of St. Paul, Minn.

[73] Assignee: Sperry Rand Corporation, New York, N.Y.

[22] Filed: May 8, 1975

[21] Appl. No.: 575,541

[52] U.S. Cl. .................. 340/173 DR; 340/173 R
[51] Int. Cl.² ...................................... G11C 7/00
[58] Field of Search ............... 340/173 R, 173 DR

[56] References Cited

UNITED STATES PATENTS

| | | | |
|---|---|---|---|
| 3,859,638 | 1/1975 | Hume | 340/173 R |
| 3,870,901 | 3/1975 | Smith et al. | 340/173 FF |

OTHER PUBLICATIONS

Harroun, Storage Refresh Control and Synchronization, IBM Technical Disclosure Bulletin, vol. 15, No. 1, pp. 257–258, 6/72.

*Primary Examiner*—Stuart N. Hecker
*Attorney, Agent, or Firm*—Thomas J. Nikolai; Kenneth T. Grace; Marshall M. Truex

[57] ABSTRACT

A compatible standby power driving circuit for a dynamic semiconductor memory includes a low impedance, high power driving circuit connected in parallel with a high impedance, low power driving circuit. The outputs of the high power and low power driving circuits are mutually connected to the column driving circuit output and the inputs of both driving circuits are connected to the refresh address selection line so that both the output of the high power driving circuit and the low power driving circuit are available under normal or regular power conditions and the low power driving circuit output is available under standby power conditions.

10 Claims, 2 Drawing Figures

COMPATIBLE STANDBY POWER DRIVER FOR A DYNAMIC SEMICONDUCTOR

BACKGROUND OF THE INVENTION

1. Field of the Invention

This invention relates to dynamic semiconductor memory systems. More particularly, this invention relates to a novel standby driving circuit for refreshing the information stored in a dynamic semiconductor memory system during power failure.

2. Description of the Prior Art

Dynamic semiconductor memory systems are well-known. The semiconductor industry is presently supplying packaged modules which may be arranged in X, Y and Z memory planes to create solid state memories for the largest and fastest commercial computers being made today. One disadvantage of a dynamic semiconductor memory system is that it is a volatile medium, i.e., there is a tendency for the information which is stored in the memory to be lost during power failures. Also, such memories have destructive readout (DRO) properties and during normal read-in and read-out operations, the information must be resupplied or rewritten into the semiconductor memory. Furthermore, dynamic semiconductor memories tend to lose their information with passage of time and therefore must be periodically "refreshed."

Heretofore, it was known that a dynamic semiconductor memory system could be refreshed by periodically interrupting the normal read and write operations and supplying a refresh address or refresh signal on the address lines of the semiconductor matrix. Heretofore, it also has been common practice to provide an independent and secondary refresh address driving means which is turned on at the time power failure is sensed. Such prior art standby refresh address driving systems require a time lag to become operable and as a result the memory may lose the information which is supposed to be refreshed. Further, standby refresh address power driving systems have heretofore required an inordinately large amount of power to sustain or refresh the dynamic semiconductor memory which has resulted in rapid drain of the standby power source.

SUMMARY OF THE INVENTION

The present invention provides a novel low power driving circuit which may be added to a conventional refresh address driving circuit of a dynamic memory.

The principal object of the present invention is to provide a refresh address driving circuit which is always active and does not require any switching time to turn on once power is lost.

Another object of the present invention is to provide a refresh address driving circuit which requires less power drain than known prior art refresh address driving circuits.

Another object of the present invention is to provide a standby refresh address driving circuit which is always active and is compatible with the normal active refresh address driving circuit.

Yet another object of the present invention is to provide circuit means for converting normal dynamic semiconductor memories into non-destructive readout (NDRO) dynamic semiconductor memories.

According to the above objects and principles of the present invention there is provided in a dynamic semiconductor memory system a low power and high impedance refresh address driving circuit which is powered by an always-on power source. The low power refresh address driving circuit is connected in parallel with the normal high power and low impedance driving circuit which is powered by an interruptible power supply so that the refresh address signals on the refresh address selection line generate driving signals indicative of a column address for refreshing information stored in the dynamic semiconductor memory system during power interruptions.

Other objects, features and advantages of the present invention will become apparent to those skilled in the art from a reading of the following detailed description of the preferred embodiment, in light of the following drawings in which:

DESCRIPTION OF THE PREFERRED EMBODIMENT

For purposes of this invention it will be assumed that the dynamic semiconductor memory matrix comprises MOSFET single transistor per cell devices with a chargeable capacitor in the gate to provide the memory for the individual transistors. The dynamic semiconductor memory matrix to be explained will be assumed to have 64 rows and 64 columns which are accessible by a six bit row address and a six bit column address. Dynamic memory devices having 64 columns and 64 rows are commercially available as MOS random access memory (RAM) devices such as the TMS 4030 device made by Texas Instruments, Inc. The principles to be applied in the above described dynamic semiconductor memory matrix are applicable to other dynamic semiconductor memories which employ more than a single MOSFET per cell such as memories which employ three MOSFET transistors per active cell.

Figure 1:
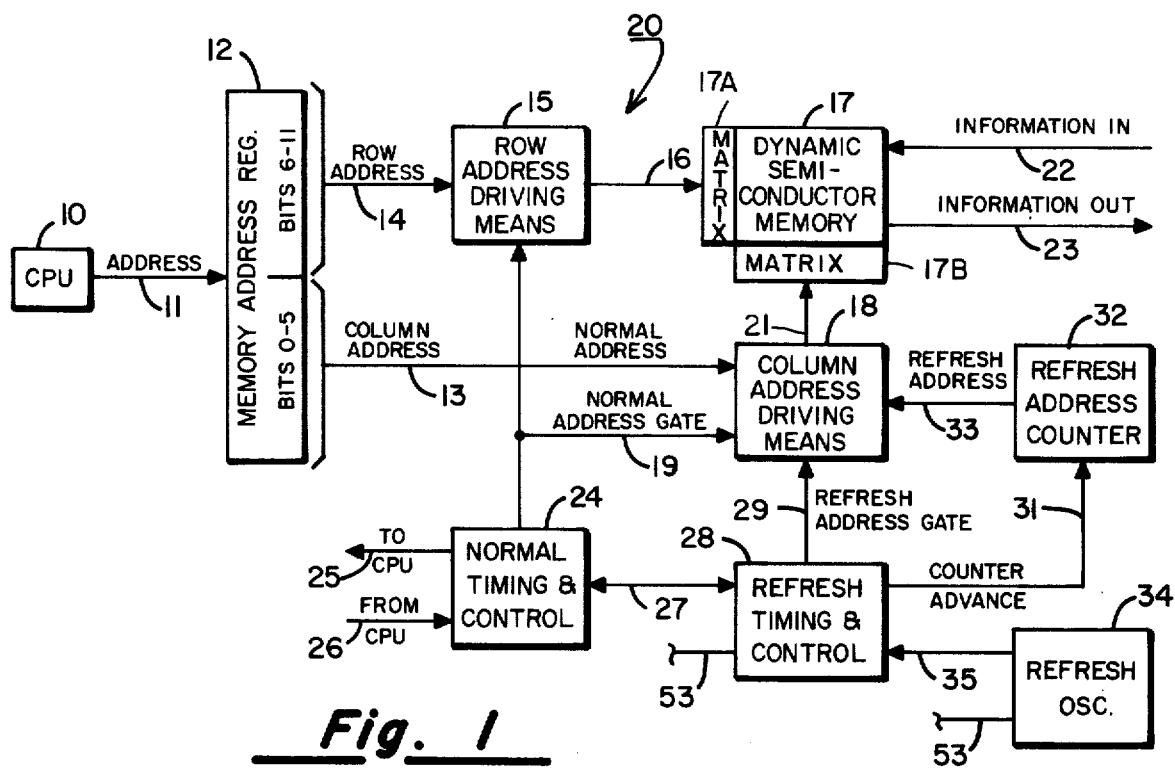
FIG. 1 is a block diagram of a typical dynamic semiconductor memory system in which the present invention is embodied.

Refer now to FIG. 1 where an address on line 11 from the CPU 10 is first entered into the memory address register 12. The 12 bit address on cable 11 is stored in stages 0 to 11 of register 12. Bits 0 to 5 define the column address on cable 13 and bits 6 through 11 define the row address on cable 14. The row address is gated and amplified in row address driving means 15 and the active signals from the plurality of drivers defining the row address are transmitted on a plurality of driving lines in cable 16 to the cell matrix 17A of dynamic semiconductor memory matrix 17. Bits 0 to 5 generate the normal column address on normal column address cable 13 and are transmitted to the column address driving means 18. Normal address gating signals on line 19 cause the normal column address signals on the lines in cable 13 to be gated and amplified in column address gating means 18 to generate a plurality of signals on the lines in cable 21 indicative of the column address. The plurality of signals on cable lines 16 and 21 are decoded and applied to cell matrix (17B) inside of dynamic semiconductor memory 17 to select a single row and column line. When information is read into the dynamic semiconductor memory, it is passed via information read-in lines 22 and when information is read-out it is passed via information read-out lines 23. The read-in and read-out information is passed in parallel to and from active registers (not shown) in the CPU 10.

Dynamic semiconductor memory system 20 of FIG. 1 includes normal timing and control circuits 24 which are implemented by the CPU 10 via lines 25 and 26. When the refresh address oscillator 34 is active, it produces a signal on line 35 which initiates a refresh cycle. The refresh timing and control circuits 28 generate the refresh address gating signals on lines 29. It will be understood that in the present system the normal address gating signal on line 19 inhibits the refresh address gating signal on line 29 and the refresh address gating signal on line 29 inhibits the normal address gating signal on line 19.

In the dynamic semiconductor memory system 20 whenever a "read" or "write" operation occurs, the semiconductor devices associated with the column being accessed are refreshed during the read/write operation. For example, if a transistor in column 7 of the memory 17 is written into or read out, the other transistors in column 7 are refreshed during the read/write cycle. During normal access to the dynamic semiconductor memory matrix, it cannot be assured that the transistors or cells in all 64 columns will be subjected to a read or a write operation during the critical time for refreshing or recharging the capacitors in the gate electrodes of the transistors. Accordingly, it is necessary to generate "refresh" signals similar to read and write signals on all of the columns in the dynamic semiconductor memory matrix 17 to refresh or recharge the capacitors in the gate circuits of the memory transistor cells. The normal timing and control circuits 24 will continue normal read and write operations by generating normal address gating signals on lines 19 but will not interrupt the normal read and write operations for a refresh operation. When a refresh cycle is initiated during a normal read or write operation, the refresh cycle will begin at the end of the read or write cycle. Approximately every thirty-two microseconds the refresh oscillator 34 will energize the refresh timing and control circuits 28 via line 35. When permitted by the normal timing and control circuits 24 via line 27, the refresh timing and control circuits 28 will generate refresh address gating signals on line 29 which permit one of the series of columns to be recharged and refreshed as will be explained further hereinafter. The refresh timing and control circuits 28 also generate a timing or counter advance signal on line 31 to the refresh address counter circuits 32 which generates the scanning or refresh address signals on lines 33 indicative of one of the 64 column addresses. The counter advance timing signals on line 31 are enabled by refresh oscillator 34 via line 35.

Figure 2:
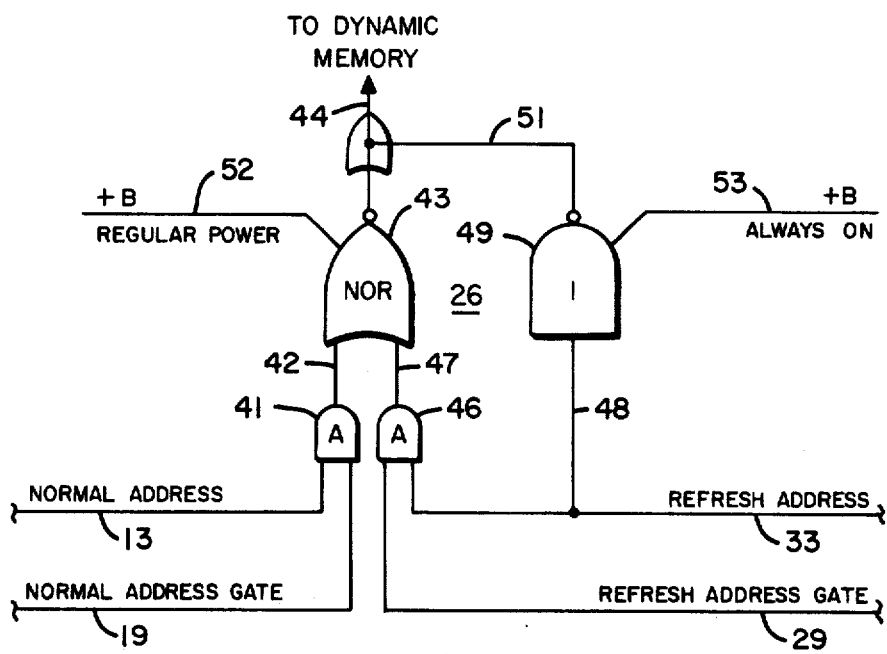
FIG. 2 is a schematic block diagram of one of the column address driving circuits embodying the present invention.

Refer now to FIG. 2 showing one of the plurality of driving circuits which are embodied in the column address driving means 18. For purposes of this explanation it has been assumed that there are bits 0 to 5 in memory address register 12 which define six column address bits and bits 6 to 11 define six row address bits. In the binary coded decimal system these bits will define one of $2^6$ or 64 columns or rows. Accordingly, there are provided in column address driving means 18 six such driving circuits as are shown in FIG. 2. It will be understood that each one of the six column address signals on line 13 will connect to one of the six drivers. A signal on normal column address line 13 is supplied to AND gate 41 and is gated through gate 41 by a normal address gating signal on line 19 to create an output on line 42. The output on line 42 is applied to NOR gate 43 to produce an output on line 44 which is applied to the decoding circuits (not shown) in dynamic semiconductor memory matrix 17 to select one of the columns of the cell matrix 17A. For purposes of this invention, NOR gate 43 may be a Series 7451 dual, two wide, two input AND-OR-INVERT gate of the type made by Texas Instruments, Inc. The bipolar NOR gate 43 has a characteristic output impedance of the order of 50 ohms and can drive or sink approximately 20 milliamperes with a + regular voltage supply B+ of the order of 5 volts.

During normal read and write operations, the high power driving gates 43 are selected by the normal address lines 13 via normal address gating signals on line 19 applied at AND gate 41. During the read and write operations it will be understood that row addresses and rows are also selected by the row address driving means and the gating signals on line 19, as explained hereinbefore. During the refresh mode of operation the refresh address counter 32 is sequencing or sequentially scanning the six high power driving gates 43 on refresh address selection lines 33 and are selected by the refresh address gating signals on line 29 which are applied to AND gate 46. The refresh column address signal is generated at the output of AND gate 46 on line 47 and is buffered and amplified through NOR gate 43 to generate a signal of equal intensity and magnitude as the read or write signal on line 44. Since the refresh address selection signal on line 33 is only generated or implemented during the refresh mode, the signal may be applied directly via line 48 to the inverter 49, which is a low power driving gate, to produce an output signal on line 51 which is applied to the output or driving line 44. It will be understood that during the refresh address mode, there is a signal generated by the high power driving gate 43 and the low power driving gate 49.

The low power driving gate 49 is preferably a C-MOS device such as a 74 CO4 made by National Semiconductor, Inc. Gate 49 has a characteristic impedance of approximately 1000 ohms and will drive or sink approximately 1.75 milliamperes. The output of low power driving gate 49 will not interfere with the driving power of NOR gate 43 during the normal refresh address selection mode. Low power driving gate 49 is powered by an always-on power supply (not shown) connected to line 53 which will be active even during power interruptions and power failures. During the refresh address mode, should the high power driving gate 43 lose its regular power source connected to line 52 there will be no output from NOR gate 43. However, the low power output from driving gate 49 will be sufficient to generate a refresh signal on line 44 which will maintain the dynamic semiconductor memory recharged and effective.

The dynamic semiconductor memory matrix 17 in the preferred embodiment can be restored or maintained with a 2.2 volt minimum signal to maintain the logic "1" level. A 0.8 volt maximum signal will maintain the logic "0" level. Thus, the low power driving circuit 49 will maintain the columns of the dynamic semiconductor memory matrix active even during power failure.

In the preferred embodiment shown in FIGS. 1 and 2 the always-on power supply connected to line 53 is coupled to column address driving means 18, refresh timing and control circuits 28, refresh address counter circuits 32 and the refresh oscillator 34. The always-on power supply can be connected in a manner which will always maintain its power level without dissipating the backup or battery supply.

Having explained the preferred embodiment of the present invention, it will be understood that a plurality of driving circuits such as shown in FIG. 2 are employed to implement read and write operations and are further employed to implement the refresh address mode operation. The normal address is always gated through AND gate 41 of the individual driving circuits and the refresh address is always gated through AND gate 46 when power is normally on. Both AND gates 41 and 46 are normally off when power is interrupted or normal power is off. Thus, during the refresh mode, the refresh address selection line 33 is effective, via line 48 and inverter 49, to generate the refresh address signal on line 51. The refresh address mode, once in operation, always has priority and will complete its cycle and will block any normal address mode operations. The normal address mode is operable approximately 60 times more often than the refresh address mode, even though the refresh address mode could be operated at less frequent intervals. The normal read or write operation requires only a few nanoseconds and the refresh address mode may be efficiently interposed at the end of a normal memory cycle. Both the refresh address mode and the read and write mode act to lock out other operable modes until their mode or cycle of operation is complete.

It will be understood that C-MOS devices require very low power drain and display relatively high impedance. Therefore, when operating from standby power there is very little drain on the battery or always-on power source connected to line 53. Further, it will be understood that the C-MOS device 49 described above is a NAND gate which operates normally in the off condition with no power drain.

While there has been described an exemplary embodiment of the invention, it will be apparent that various modifications and substitutions may be made to the arrangement and, therefore, the scope of the invention is to be limited only as set forth in the following claims.

What is claimed is:

1. In a dynamic semiconductor memory system, a compatible circuit driven by always-on standby power for refreshing the information stored in said memory system during normal power failure, comprising:
   a dynamic semiconductor memory matrix;
   row address driving means for generating an address indicative of a row in said matrix;
   column address driving means for generating an address indicative of a column in said matrix;
   said column address driving means comprising a plurality of column address drivers, each said column address drivers comprising:
   a high power driving gate adapted to be connected to a source of normal interruptible power;
   a low power driving gate adapted to be connected to a source of always-on power;
   said driving gates of each said column address driving means being connected together in a logical OR at their outputs;
   a normal address selection gate connected to the input of said high power driving gate;
   a refresh address selection gate connected to the input of said high power driving gate;
   mode enabling lines connected to said selection gates for enabling one of said selection gates;
   a refresh address selection line connected to the input of said refresh address selection gate and to the input of said low power driving gate, whereby an input signal on said refresh address selection line always produces a signal output at said column address driver.

2. In a dynamic semiconductor memory system as set forth in claim 1 wherein each said low power driving gate comprises a normally off inverter.

3. In a dynamic semiconductor memory system as set forth in claim 2 wherein each said low power driving gate comprises a normally off NAND gate connected as a single input inverter.

4. In a dynamic semiconductor memory system as set forth in claim 3 wherein said low power driving gate comprises a low power drain NAND gate.

5. In a dynamic semiconductor memory system as set forth in claim 4 wherein said low power driving gate comprises a CMOS NAND gate.

6. In a dynamic semiconductor memory system as set forth in claim 5 wherein said high power driving gate comprises a bipolar NOR gate.

7. In a dynamic semiconductor memory system as set forth in claim 1 wherein said low power driving gate comprises a high impedance load in the output circuit of said high power driving gate.

8. In a dynamic semiconductor memory system as set forth in claim 1 which further includes a refresh address counter for generating signals on said refresh address selection lines indicative of a column in said matrix.

9. In a dynamic semiconductor memory system as set forth in claim 8 which further includes a refresh timing and control means wherein said refresh address counter and said refresh timing and control means are connected to said source of always-on power.

10. In a dynamic semiconductor memory system of the type having a matrix comprised of rows and columns of dynamic semiconductor memory elements, row address driving means for generating address representing signals indicative of a row in said matrix, column address driving means for generating address representing signals indicative of a column in said matrix, the improvement comprising X column address driver circuits including
   a. a high power driving gate adapted to be connected to a source of normal interruptible power;
   b. a low power driving gate adapted to be connected to a source of always-on power;
   c. means for logically combining the output terminals of said high power driving gate and said low power driving gate;
   d. means for selectively applying normal or refresh address representing signals to the input of said high power driving gate; and
   e. means for also connecting said refresh address representing signals to the input of said low power driving gate, whereby an output is produced at the output of said column address driver circuit even in the absence of said normal interruptible power.

* * * * *